(12) United States Patent
Hirose et al.

(10) Patent No.: US 8,864,908 B2
(45) Date of Patent: Oct. 21, 2014

(54) CRUCIBLE PROTECTION SHEET AND CRUCIBLE APPARATUS USING THE CRUCIBLE PROTECTION SHEET

(75) Inventors: Yoshiaki Hirose, Mitoyo (JP); Tetsuya Yuki, Mitoyo (JP)

(73) Assignee: Toyo Tanso Co., Ltd., Osaka-shi (JP)

( * ) Notice: Subject to any disclaimer, the term of this patent is extended or adjusted under 35 U.S.C. 154(b) by 1530 days.

(21) Appl. No.: 12/373,182

(22) PCT Filed: Jul. 9, 2007

(86) PCT No.: PCT/JP2007/063661
§ 371 (c)(1),
(2), (4) Date: Jan. 9, 2009

(87) PCT Pub. No.: WO2008/007637
PCT Pub. Date: Jan. 17, 2008

(65) Prior Publication Data
US 2009/0308307 A1  Dec. 17, 2009

(30) Foreign Application Priority Data

| Jul. 14, 2006 | (JP) | 2006-193618 |
| Jul. 14, 2006 | (JP) | 2006-193619 |
| Jul. 14, 2006 | (JP) | 2006-193620 |
| Aug. 31, 2006 | (JP) | 2006-235255 |
| Nov. 15, 2006 | (JP) | 2006-309491 |

(51) Int. Cl.
| C30B 35/00 | (2006.01) |
| C30B 13/28 | (2006.01) |
| C30B 15/20 | (2006.01) |
| C30B 15/26 | (2006.01) |
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| F27B 14/10 | (2006.01) |
| C30B 15/10 | (2006.01) |

(52) U.S. Cl.
CPC .............. F27B 14/10 (2013.01); C30B 15/10 (2013.01)
USPC ............ 117/213; 117/200; 117/201; 117/206

(58) Field of Classification Search
USPC .................................. 117/213, 200, 201, 206
See application file for complete search history.

(56) References Cited

U.S. PATENT DOCUMENTS 3,492,197 A * 1/1970 Bonorden et al. ............ 428/412
4,117,051 A * 9/1978 Ishikawa et al. ............ 264/29.1
(Continued)

FOREIGN PATENT DOCUMENTS

| CN | 1480394 A | 3/2004 |
| GB | 2446087 A | 7/2008 |

(Continued)

OTHER PUBLICATIONS

Chinese Office Action dated Oct. 26, 2011, issued in corresponding Chinese Patent Application No. 200780026431.3.

(Continued)

*Primary Examiner* — James McDonough
(74) *Attorney, Agent, or Firm* — Westerman, Hattori, Daniels & Adrian, LLP (57) ABSTRACT

A crucible protection sheet is provided that can prevent damages to an inner crucible, hinder an outer crucible from silicon-carbidization, and transmit heat from the outer crucible to the inner crucible uniformly.
In a crucible having an inner crucible 2 and an outer crucible 3, the crucible protection sheet is arranged between the two crucibles and is made of expanded graphite. The planar thermal conductivity is 120 W/(m·K) or higher, the gas permeability is less than $1.0 \times 10^{-4}$ cm$^2$/s, and the compression ratio is 20% or higher when the sheet is compressed in a thickness direction at a pressure of 34.3 MPa. Since the compression ratio is high, the effect of preventing breakage is great when inserting the inner crucible, improving workability and preventing the inner crucible from tilting inside the outer crucible. In addition, even though the compression ratio is high, the thermal conductivity is kept to such a degree that the inner crucible can be heated uniformly, and the gas shielding capability is also ensured. As a result, the outer crucible is prevented from silicon-carbidization and thickness decrease.

19 Claims, 4 Drawing Sheets

(56) References Cited

U.S. PATENT DOCUMENTS

| | | | | |
|---|---|---|---|---|
| 4,888,242 | A | * | 12/1989 | Matsuo et al. ............... 428/408 |
| 6,133,178 | A | * | 10/2000 | Yamada et al. ............... 501/54 |
| 2002/0088390 | A1 | | 7/2002 | Thebault et al. |
| 2003/0148104 | A1 | | 8/2003 | Kahl et al. |
| 2004/0043220 | A1 | * | 3/2004 | Hirose et al. ............... 428/408 |
| 2005/0196613 | A1 | | 9/2005 | Hirose et al. |
| 2007/0110661 | A1 | | 5/2007 | Hirose |

FOREIGN PATENT DOCUMENTS

| | | | |
|---|---|---|---|
| JP | 63-139010 | A | 6/1988 |
| JP | 63-149142 | A | 6/1988 |
| JP | 1-167210 | A | 6/1989 |
| JP | 3-23209 | A | 1/1991 |
| JP | 3-223196 | A | 10/1991 |
| JP | 4-21509 | A | 1/1992 |
| JP | 6-2637 | B2 | 1/1994 |
| JP | 06-75717 | A | 10/1994 |
| JP | 07-118067 | A | 5/1995 |
| JP | 2528285 | B2 | 8/1996 |
| JP | 08-333171 | A | 12/1996 |
| JP | 2566244 | B2 | 12/1996 |
| JP | 2620606 | B2 | 6/1997 |
| JP | 10-167742 | A | 6/1998 |
| JP | 2923260 | B2 | 7/1999 |
| JP | 11-228166 | A | 8/1999 |
| JP | 11-278857 | A | 10/1999 |
| JP | 2001-261481 | A | 9/2001 |
| JP | 2002-226292 | A | 8/2002 |
| JP | 2003-127267 | A | 5/2003 |
| JP | 3410380 | B2 | 5/2003 |
| JP | 2003-252615 | A | 9/2003 |
| JP | 2003-267781 | A | 9/2003 |
| JP | 2004-75521 | A | 3/2004 |
| JP | 2006-62922 | A | 3/2006 |
| JP | 2007-108048 | A | 4/2007 |

OTHER PUBLICATIONS

European Search Report dated Feb. 19, 2010, issued in European Patent Application No. 07791349.9.
Chinese Office Action dated Feb. 12, 2011, issued in Chinese Patent Application No. 200780027632.5.
"Development and Market Expansion of New Carbon Materials," CMC Co., Ltd; Nov. 29, 1996; pp. 38-42.
International Search Report of PCT/JP2007/063661, date of mailing Sep. 18, 2007.
Chinese Office Action dated May 18, 2011, issued in corresponding Chinese Patent Application No. 200780026431.3.
Chinese Office Action dated Sep. 27, 2012, issued in corresponding Chinese Patent Application No. 200780026431.3, with English translation (16 pages).
Chinese Office Action dated Sep. 27, 2012, issued in corresponding Japanese Patent Application No. 200780026431.3, with English translation (16 pages).
Taiwanese Office Action dated Nov. 13, 2012, issued in correspondings Taiwanese Patent Application No. 096125727, with English translation (11 pages).
Chinese Examination Decision on the Reexamination Request dated Dec. 5, 2012, issued in corresponding Chinese Application No. 200780026431.3, with English translation (25 pages).
Korean Office Action dated Nov. 30, 2013, issued in corresponding Korean Patent Application No. 10-2008-7028660, w/ English translation.

* cited by examiner

CRUCIBLE PROTECTION SHEET AND CRUCIBLE APPARATUS USING THE CRUCIBLE PROTECTION SHEET

TECHNICAL FIELD

The present invention relates to a crucible protection sheet, a crucible apparatus that uses the crucible protection sheet, and the like. More particularly, the invention relates to a crucible apparatus comprising an outer crucible and an inner crucible, a crucible protection sheet that is disposed between the two crucibles and used for protecting these crucibles, and the like.

BACKGROUND ART

Known methods for obtaining a single crystal silicon ingot include a floating zone melting process (FZ process) and a Czochralski process (CZ process). The CZ process is used commonly. When manufacturing a silicon single crystal or the like by the CZ process, a crucible apparatus is used. The crucible apparatus comprises an outer crucible that is heated by a heater or the like, and an inner crucible in which raw materials such as a silicon single crystal are accommodated. Usually, a crucible made of quartz is employed for the inner crucible from the viewpoint of the reactivity with silicon and the purity, whereas a crucible made of graphite is employed for the outer crucible from the viewpoint of the purity, the heat resistance, and the strength. The crucible apparatus is used for manufacturing silicon single crystals and the like in the state in which the inner crucible is inserted in the outer crucible.

The above-described crucible apparatus generally has the problems as shown in the following (1) and (2).
(1) The inner crucible made of quartz is heavy in weight and low in impact resistance. Therefore, extra care must be taken when inserting the inner crucible into the outer crucible. This leads to the problem of poor workability. Another problem is that, since there is a difference in thermal expansion coefficient between the inner crucible and the outer crucible, damages such as cracks are caused in both crucibles when cooling the crucibles after finishing the manufacture of a silicon single crystal or the like. Still another problem is that SiO gas or the like generated from the quartz crucible causes a reaction with the outer crucible and silicon-carbidization and thickness decrease occur in the outer crucible.

To resolve such problems, it has conventionally been proposed that a member for protecting the outer crucible and the inner crucible from damages should be provided between the crucibles ([a] and [b] below).
[a] One proposal is as follows. A sheet or fabric in which pyrocarbon is coated on the surface of a carbon fiber member, such as textile made of carbon fiber, has been disclosed. A proposal is that the sheet or fabric should be disposed between the outer crucible and the inner crucible. (See, for example, Patent References 1 and 2 listed below.) It has been described that according to such a configuration, the sheet or the like can function as a cushioning material since the sheet or the like has a certain degree of flexibility, and that the reaction of the SiO gas or the like generated from the inner crucible with the outer crucible can be prevented since the pyrocarbon coated on the surface reacts with the SiO gas or the like.
[b] Another proposal is as follows. An expanded graphite sheet, in which expanded graphite is formed into a sheet shape, is superior in flexibility and compressibility to the carbon fiber member. Such an expanded graphite sheet should be used as a crucible protection sheet. (See, for example, Patent References 3 to 5 listed below.)
The expanded graphite sheet is a material that has flexibility and shows high compression ratio and high recovery ratio. It also shows good planar thermal conduction capability. Therefore, it is effective to uniformize the temperatures along vertical directions of the crucibles, and it also serves to alleviate heat impact and expansion-contraction stress of thermal expansion. Moreover, Patent Reference 3 describes that the expanded graphite sheet is resistant to gas permeability because it is a highly anisotropic material with very low gas permeability.
(2) In order to improve the quality of the single crystal silicon manufactured by the CZ process, it is required that the purity of polycrystalline silicon, which is the raw material, be as high as possible, or in other words, the amount of impurities be as small as possible.

Nevertheless, in the actual manufacturing of single crystal silicon, a trace amount of impurity as a dopant element is added to the raw material, the polycrystalline silicon, in order to obtain a single crystal silicon with desired electric characteristics, and the single crystal silicon is manufactured from the polycrystalline silicon containing such a dopant element.

Here, if the amount of the dopant element existing in the molten silicon is not controlled, an abnormality will occur in the quality of the manufactured single crystal silicon. During the manufacture, impurities may evaporate from the crucible apparatus used for melting the polycrystalline silicon, specifically, from the inner crucible, the outer crucible, and the sheet disposed between the inner and outer crucibles. It is feared that these impurities may contaminate the molten silicon.

It is impossible to control the amount of such impurities originating from the crucible apparatus. Therefore, currently, it has been proposed that the possibility of contamination of the molten silicon by impurities should be lowered by minimizing the amount of impurities contained in the crucible apparatus itself (see Patent References 6 to 8 listed below).

[Patent Reference 1] Japanese Published Unexamined Patent Application No. 2001-261481
[Patent Reference 2] Japanese Published Unexamined Patent Application No. 2002-226292
[Patent Reference 3] Japanese Patent No. 2528285
[Patent Reference 4] Japanese Published Unexamined Patent Application No. 2003-267781
[Patent Reference 5] Japanese Published Unexamined Patent Application No. 2004-75521
[Patent Reference 6] Japanese Published Examined Patent Application No. H6-2637
[Patent Reference 7] Japanese Patent No. 2923260
[Patent Reference 8] Japanese Patent No. 3410380

DISCLOSURE OF THE INVENTION

Problems to be Solved by the Invention

However, the above-described crucible apparatuses have the following problems.
Problems Related to (1) [a]
In the case of disposing carbon fiber between the two crucibles, the carbon fiber can be disposed so as to change its shape along the outer surface of the inner crucible and the inner surface of the outer crucible because carbon fiber has a certain degree of flexibility. However, the carbon fiber members disclosed in Patent References 1 and 2 have the following problems. The carbon fiber members cannot absorb the impact that is caused when the inner crucible is inserted into the outer crucible because they do not have high compressibility. Moreover, they cannot sufficiently alleviate the expansion-contraction stress produced between the two crucibles during cooling of the crucibles.

In addition, even if the pyrocarbon coated on the surface is made to react with the SiO gas or the like, the SiO gas or the like that passes through the carbon fiber member exists because it is impossible to cause all the SiO gas or the like to undergo the reaction. Furthermore, because many gaps exist between the fibers, significant gas shielding capability cannot be expected. Certainly, coating with pyrocarbon achieves a certain degree of gas shielding capability. However, the flexibility is lost when the amount of coating is increased in order to enhance the gas shielding capability. This increases the possibility of breakage during the insertion work. On the other hand, when the amount of coating is reduced in order to maintain the flexibility, a large number of gaps is left between the fibers, and therefore the gas shielding capability cannot be enhanced sufficiently.

Problems Related to (1) [b]

In the expanded graphite sheet, the flexibility and compressibility are highly related to its bulk density. When the bulk density is lower, the flexibility and the compressibility are higher and the impact absorbing capability and the capability of alleviating the expansion-contraction stress are accordingly higher. On the other hand, when the bulk density is lower, the planar thermal conductivity is lower. In other words, in the expanded graphite sheet, there is a trade-off between the thermal conductivity and the flexibility, and also between the thermal conductivity and the compressibility.

Accordingly, when the compressibility of the expanded graphite sheet is increased by reducing the bulk density, the crucibles are less likely to break during the insertion work and during cooling because the flexibility and compressibility improve. However, this lowers the planar thermal conductivity and therefore degrades the temperature uniformity of the raw material and the quartz crucible during the manufacture of the silicon single crystal or the like. Consequently, the product quality is likely to degrade.

Conversely, if the thermal conductivity is increased by increasing the bulk density, the temperature uniformity in the material and the quartz crucible becomes higher during the manufacture of the silicon single crystal, so the product quality improves; however, the compressibility of the expanded graphite sheet becomes poorer, so the sheet is more likely to break when cooling the crucible.

Nevertheless, in Patent References 3 to 5, only the thickness of the expanded graphite sheet and the impurity concentration are taken into consideration in specifying the characteristics of the expanded graphite sheet. The thermal conductivity and the compression ratio are not taken into consideration both at the same time.

As for the gas shielding capability, Patent Reference 3 only contains the foregoing description, and almost no consideration on the gas shielding capability is taken in specifying the characteristics of the expanded graphite sheet. There is no example of the expanded graphite sheet disposed between the outer crucible and the inner crucible in which the gas permeability suitable for such a sheet is investigated along with the thermal conductivity and the compression ratio.

Problems Related to (2)

It is possible to hinder the contamination of the molten silicon by impurities by using a crucible apparatus containing a very small amount of impurities, in other words, a very high quality crucible apparatus. However, such a very high quality crucible apparatus is extremely costly. Consequently, it becomes a cause of cost increase of silicon manufacturing equipment, and it also leads to an increase of the production cost of the single crystal silicon. In addition, such a high quality crucible apparatus requires severe quality control in order to prevent contamination after the manufacture of the apparatus. However, the quality control for keeping the quality to be more than a predetermined degree of high purity is difficult. The cost for such quality control will also be reflected in the production cost of the single crystal silicon.

In particular, the crucible protection sheet is difficult to reuse, so basically, a new sheet is used almost every time. For this reason, although the cost of the sheet required per one time of the melting work is not so high, the production cost of the single crystal silicon increases in the long run by using a high quality sheet.

Moreover, there is a problem that the purity of the crucible protection sheet is difficult to increase and the work efficiency for increasing its purity is not as high as that for a graphite crucible. The ordinary graphite crucible is made of what is called a porous material having micropores, so impurities escape through the pores. Thus, a high purity process for the ordinary graphite crucible can be conducted in a relatively short duration in relation to its volume. On the other hand, the graphite sheet has an extremely layered structure and it is made of a material having no pores in the surface. Therefore, the graphite sheet is not easily purified although the volume is small, and it takes a long time to purify the sheet sufficiently. In addition, the crucible protection sheet has flexibility and requires care in handling in the case of a large-area sheet. This is also a cause of poorer work efficiency for increasing the purity of the sheet than the work efficiency for increasing the purity of the graphite crucible.

As described above, increasing the quality of the crucible apparatus makes it possible to improve the product quality of single crystal silicon, but it leads to an increase of the production cost. In particular, the increase of the production cost of the single crystal silicon is exacerbated by using a high quality sheet. Therefore, it has been desired to develop a crucible apparatus that can prevent the product quality of single crystal silicon from lowering and at the same time can keep the production cost low.

In view of the foregoing circumstances, it is an object of the present invention to provide a crucible protection sheet that can prevent damages to the inner crucible, can also hinder the outer crucible from silicon-carbidization, and moreover can transmit heat from the outer crucible to the inner crucible uniformly.

It is also an object of the present invention to provide a crucible protection sheet and a crucible apparatus that can hinder an increase of the production cost and moreover can effectively prevent the quality degradation of the manufactured products.

Means for Solving the Problems

In order to accomplish the foregoing objects, the present invention provides a crucible protection sheet comprising expanded graphite and being arranged between an inner crucible containing silicon and an outer crucible containing graphite, the crucible protection sheet being characterized in that: the gas permeability represented by the following equation (1) is $1.0 \times 10^{-4}$ cm$^2$/s or less, and the compression ratio represented by the following equation (2) is 20% or higher:

$$\text{Gas permeability} = Q \cdot L/(\Delta P \cdot A) \quad (1)$$

where Q is the gas flow rate (Pa·cm$^3$/s), $\Delta P$ is the pressure difference (Pa) between two chambers, A is the gas transmission area (cm$^2$) of the crucible protection sheet, which is the area of a passage that allows the two chambers to communicate with each other, and L is the thickness (cm) of the crucible protection sheet, and $$\text{Compression ratio (\%)} = [(t_1 - t_2)/t_1] \times 100 \qquad (2)$$

where $t_1$ is the thickness (mm) after applying a pre-load (0.686 MPa±1%) for 15 seconds, and $t_2$ is the thickness (mm) after applying a total pressure (34.3 MPa±1%) for 60 seconds.

According to the above-described configuration, the sheet has a high compression ratio, 20% or higher, when compressed under the predetermined conditions. Thus, it is possible to increase the effect of preventing breakage of the inner crucible, which tends to be brittle and break easily, when inserting the inner crucible into the outer crucible. As a result, workability improves remarkably when inserting the inner crucible into the outer crucible. Moreover, the crucible protection sheet can serve as a cushioning material because of the high compression ratio, so even when the inner bottom surface of the outer crucible is uneven, the inner crucible can be hindered from tilting inside the outer crucible. Furthermore, although the sheet has a high compression ratio, it is possible to prevent the outer crucible from silicon-carbidization and reducing the thickness because the gas permeability is kept to such a degree as to be capable of suppressing the permeation of the SiO gas produced when the inner crucible is heated.

It should be noted that the above-mentioned compression ratio is according to JIS R 3453, Compressed fiber jointing.

It is desirable that the upper limit value of the compression ratio be 60% or lower. The reason is that if the upper limit value of the compression ratio exceeds 60%, the crucible protection sheet cannot exhibit, for example, the effect of preventing breakage of the inner crucible sufficiently because the crucible protection sheet becomes hard.

In order to accomplish the foregoing objects, the present invention also provides a crucible protection sheet comprising expanded graphite and being arranged between an inner crucible containing silicon and an outer crucible containing graphite, the crucible protection sheet being characterized in that: the planar thermal conductivity is 120 W/(m·K) or higher, and the compression ratio represented by the following equation (2) is 20% is higher:

$$\text{Compression ratio (\%)} = [(t_1 - t_2)/t_1] \times 100 \qquad (2)$$

where $t_1$ is the thickness (mm) after applying a pre-load (0.686 MPa±1%) for 15 seconds, and $t_2$ is the thickness (mm) after applying a total pressure (34.3 MPa±1%) for 60 seconds.

According to the above-described configuration, the sheet has a high compression ratio, 20% or higher. Therefore, workability remarkably improves as described in the foregoing advantageous effect. At the same time, the inner crucible can be hindered from tilting inside the outer crucible. Moreover, although the sheet has a high compression ratio, it is possible to heat the inner crucible uniformly because the planar thermal conductivity is 120 W/(m·K) or higher. As a result, degradation in the product quality is prevented.

Here, it is desirable that the planar thermal conductivity be 120 W/(m·K) or higher.

According to the above-described configuration, it is possible to achieve a remarkable improvement in workability and prevention of tilting of the inner crucible in the outer crucible because the compression ratio is high. Moreover, it is possible to exhibit the advantageous effect of hindering permeation of the SiO gas produced when the inner crucible is heated because the gas permeability is low. At the same time, the inner crucible can be heated uniformly because the planar thermal conductivity is 120 W/(m·K) or higher. As a result, degradation in the product quality is prevented.

It is desirable that the thickness of the crucible protection sheet be from 0.2 mm to 0.6 mm.

The reason why the thickness of the crucible protection sheet is restricted in such a way is as follows. When the thickness of the crucible protection sheet is 0.2 mm or greater, the cushioning capability of the crucible protection sheet is maintained (the flexibility is retained) even if the crucible protection sheet is compressed when inserting the inner crucible. As a result, the sheet sufficiently exhibits the function of alleviating the expansion-contraction stress produced between the two crucibles during cooling the crucible. In addition, when the thickness of the crucible protection sheet is 0.2 mm or greater, degradation in the tensile strength and the flexural strength is prevented. As a result, cracking of the crucible protection sheet, for example, is prevented when inserting the inner crucible. On the other hand, when the thickness of the crucible protection sheet is 0.6 mm or less, the bendability does not degrade. As a result, the crucible protection sheet is prevented from cracks or chipping even if a bending stress is applied to the crucible protection sheet when installing the crucible.

It is desirable that the bulk density be from 0.5 Mg/m³ to 1.5 Mg/m³.

The reason why such a restriction is made is as follows. If the bulk density is less than 0.5 Mg/m³, the strength of the crucible protection sheet is so poor that cracks or the like may develop in the case that the crucible protection sheet is deformed. On the other hand, if the bulk density exceeds 1.5 Mg/m³, the shock absorption capability and the deformation volume absorbing capability may become poor.

It is desirable that the recovery ratio represented by the following equation (3) be 5% or higher.

$$\text{Recovery ratio (\%)} = [(t_3 - t_2)/(t_1 - t_2)] \times 100, \qquad (3)$$

where $t_1$ is the thickness (mm) after applying a pre-load (0.686 MPa±1%) for 15 seconds, $t_2$ is the thickness (mm) after applying a total pressure (34.3 MPa±1%) for 60 seconds, and $t_3$ is the thickness after resetting the pressure to the pre-load and elapsing 60 seconds.

The recovery ratio is high, 5% or higher, as described above. Therefore, even when a gap forms between the two crucibles because of the amount of expansion/contraction produced between the two crucibles, the crucible protection sheet can fill the gap between the two crucibles. Moreover, the cushioning capability of the crucible protection sheet can be maintained.

It should be noted that the above-mentioned recovery ratio is according to JIS R 3453, Compressed fiber jointing.

It is desirable that, when the sheet in a square shape having a side of 200 mm is divided into square-shaped test regions each having a side of 25 mm and the thermal conductivity of each test region is measured, the quotient obtained by dividing the difference between the thermal conductivity of the test region having the greatest thermal conductivity and the thermal conductivity of the test region having the least thermal conductivity by the mean value of the thermal conductivities of all the test regions should be restricted to be 0.1 or less.

According to the above-described configuration, the thermal conductivity does not vary greatly depending on the location in the crucible protection sheet. Therefore, when heat transmits within the crucible protection sheet, formation of heat spots is prevented in the crucible protection sheet. As a result, it becomes possible to prevent local softening and deformation of the quartz crucible resulting from the heat spots and quality degradation of the silicon single crystal resulting from temperature variations.

It is desirable that the total amount of impurities be 10 mass ppm or less.

According to the above-described configuration, the total amount of impurities (ash content) in the crucible protection sheet is small. Therefore, the silicon is prevented from being contaminated. As a result, the quality of the pulled silicon single crystal becomes higher.

It is desirable that the total amount of impurities be 100 mass ppm or less, and among a plurality of impurities contained therein, the amount of at least one element of boron, phosphorus, arsenic, antimony, bismuth, and a metallic element be 3 mass ppm or less.

In addition, the metallic element is iron or indium.

In addition, it is desirable that the amount of each of the boron, the phosphorus, the arsenic, the antimony, the bismuth, the iron, and the indium be 3 mass ppm or less.

It is desirable that the total amount of the boron, the phosphorus, the arsenic, the iron, the antimony, the indium, and the bismuth be 10 mass ppm or less.

The reasons will be discussed later.

It is possible to employ a configuration in which a plurality of crucible protection sheets are stacked on each other, each of the crucible protection sheets being a crucible protection sheet as described above.

When constructing a crucible protection sheet material by stacking a plurality of the above-described crucible protection sheets, the strength of the crucible protection sheet material as a whole can be made high even if the thickness of each sheet is small. As a result, breakage of the crucible protection sheet can be prevented. Moreover, even if one of the crucible protection sheets breaks, the function as the crucible protection sheets is sustained by the presence of the other crucible protection sheets. In addition, the SiO gas passes through the sheet material less easily than in the case of using only one crucible protection sheet since there is interface resistance at the interface between the crucible protection sheets. As a result, the SiO gas is less likely to reach the outer crucible, so the gas shielding capability further improves.

In order to accomplish the foregoing objects, the present invention also provides a crucible protection sheet comprising expanded graphite and being arranged between an inner crucible and an outer crucible of a crucible having the inner crucible and the outer crucible, the crucible protection sheet being characterized in that: the total amount of impurities is 100 mass ppm or less; and among a plurality of the impurities contained therein, the amount of at least one element of boron, phosphorus, arsenic, antimony, bismuth, and a metallic element is 3 mass ppm or less.

In the above-described configuration, the amount of at least one of the elements among boron, phosphorus, and so forth (hereinafter also collectively referred to as "specific elements"), which significantly affect the quality of the product manufactured by using the crucible (hereinafter also simply referred to as a "product"), is controlled to be 3 mass ppm or less. Therefore, the quality abnormality of the product can be suppressed. On the other hand, the total amount of impurities in the sheet is 100 mass ppm or less, so the quality of the crucible protection sheet may not be so high. This facilitates the manufacture of the crucible protection sheet and the quality control of the crucible protection sheet. As a result, the product quality can be kept high while keeping the manufacturing cost of the product low.

It should be noted that the specific elements are restricted to boron, phosphorus, arsenic, antimony, bismuth, and a metallic element for the following reason. Specifically, the following problems are considered. Boron, phosphorus, arsenic, antimony, and bismuth are used as dopants when manufacturing semiconductors. For this reason, if these elements are contained in the product, desired characteristics cannot be obtained by a subsequent doping process. Also, if a metallic element is contained, a semiconductor may not be produced but a conductor may be produced.

The metallic element is iron or indium.

When these metals are contained, the product is particularly apt to become a conductor.

In addition, it is desirable that the amount of each of the boron, the phosphorus, the arsenic, the antimony, the bismuth, the iron, and the indium be 3 mass ppm or less.

When the amount of each of the elements that are particularly problematic in manufacturing the product is restricted, the product quality can be improved further.

It is desirable that the total amount of the boron, the phosphorus, the arsenic, the iron, the antimony, the indium, and the bismuth be 10 mass ppm or less.

When the total amount of the specific elements is also restricted as in the above-described configuration, the advantageous effect of preventing quality abnormality of the product is exhibited more significantly.

In order to accomplish the foregoing objects, the present invention also provides a crucible apparatus comprising an inner crucible, an outer crucible, and a crucible protection sheet comprising expanded graphite and being arranged between the inner crucible and the outer crucible, the crucible apparatus being characterized in that: the crucible protection sheet is a the crucible protection sheet described above; and the total weight of impurities of the crucible protection sheet and the outer crucible with respect to the total weight of the crucible protection sheet and the outer crucible is 30 mass ppm or less.

According to the above-described configuration, the total amount of impurities in the crucible protection sheet and the crucible is small. Therefore, the amount of impurities that contaminate the material is lessened. Moreover, the quality of each of the components need not be increased unnecessarily, so the manufacturing and quality control of each of the components are easy. Thus, the manufacturing cost of the product can be lowered, and at the same time, the product quality can be kept high.

It is desirable that the outer crucible be a graphite crucible having a total amount of impurities of 20 mass ppm or less.

According to the above-described configuration, the outer crucible is a graphite crucible, and the amount of impurities thereof is kept low. Therefore, the total amount of the impurities in the apparatus is small, and quality abnormality of the product is prevented. Moreover, the quality of the crucible protection sheet, the purity of which is more difficult to increase than the outer crucible, need not be increased unnecessarily. As a result, the manufacturing of the crucible protection sheet and the quality control of the crucible protection sheet are made easy. Thus, the manufacturing cost of the product can be lowered, and at the same time, the product quality can be kept high.

It is desirable that the outer crucible be a carbon composite crucible having a total amount of impurities of 20 mass ppm or less.

According to the above-described configuration, the outer crucible is a carbon composite (C/C) crucible, and the amount of impurities thereof is kept low. Therefore, the total amount of the impurities in the apparatus is small, and quality abnormality of the product is prevented. Moreover, the quality of the crucible protection sheet, the purity of which is more difficult to increase than the outer crucible, need not be increased unnecessarily. As a result, the manufacturing of the crucible protection sheet and the quality control of the crucible protection sheet are made easy. Thus, the manufacturing cost of the product can be lowered, and at the same time, the product quality can be kept high.

Advantages of the Invention

As described above, the present invention exhibits the significant advantageous effects of preventing damages to the inner crucible, hindering the outer crucible from silicon-carbidization, and transmitting heat from the outer crucible to the inner crucible uniformly. The invention also exhibits the significant advantageous effects of hindering an increase of the production costs and at the same time preventing the quality degradation of the manufactured products effectively.

BEST MODE FOR CARRYING OUT THE INVENTION

First Embodiment

A first embodiment of the invention will be described with reference to the drawings.

Figure 1:
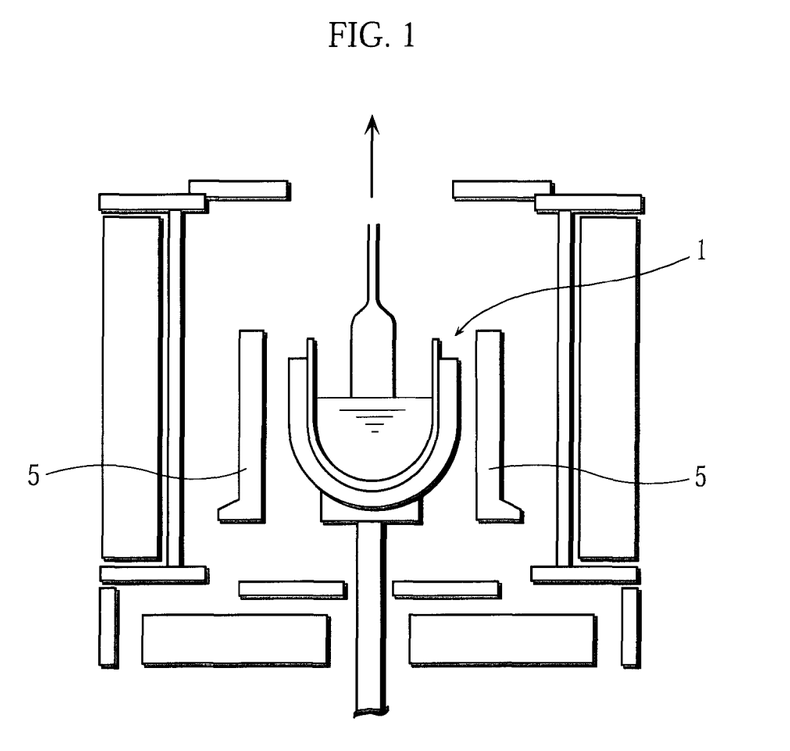

Before describing a crucible protection sheet of the present invention, an apparatus using the crucible protection sheet will be described briefly. FIG. 1 is a schematic illustrative view of equipment for manufacturing silicon single crystals or the like, and FIG. 2 is a partially enlarged view of a crucible 1.

Figure 2:
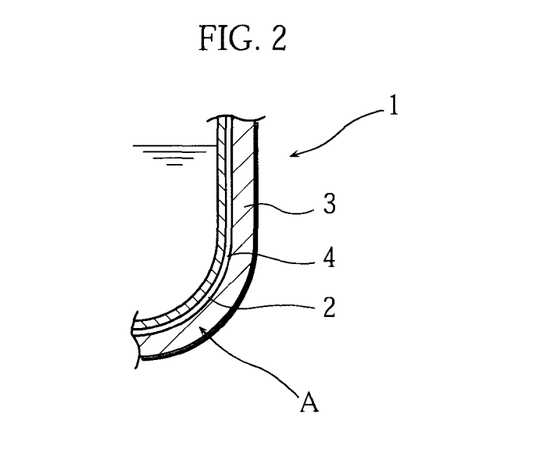
FIG. 2 is a partially enlarged view of FIG. 1.

In FIGS. 1 and 2, reference numeral 1 denotes a crucible that accommodates polycrystalline silicon, which is a raw material of silicon single crystals or the like. A the heater 5 is arranged around the crucible apparatus 1, and the crucible apparatus 1 is heated by radiant heat from the heater 5. The polycrystalline silicon is heated and melted by heat conduction from the crucible apparatus 1 when the crucible apparatus 1 is heated by the heater 5. Thus, by bringing the molten silicon into contact with a seed crystal and pulling up the molten silicon, a silicon single crystal can be manufactured.

Normally, the crucible apparatus 1 comprises an inner crucible 2 made of quartz, an outer crucible 3 made of graphite (the weight of which is, for example, about 20 kg to about 100 kg), and a crucible protection sheet 4 disposed between the two crucibles 2 and 3. The crucible protection sheet 4 is provided for hindering the outer crucible 3 from silicon-carbidization, for preventing breakage when inserting the inner crucible 2 into the outer crucible 3, and for preventing damages caused by a difference in thermal expansion coefficient between the materials that form the crucibles 2 and 3 when cooling the crucible apparatus 1 after finishing the manufacture of silicon single crystals or the like.

Here, of course, the crucible protection sheet of the present invention, which is used under the conditions as described above, needs to be capable of conducting heat from the outer crucible to the inner crucible. In addition, the crucible protection sheet needs to have the following characteristics.
(a) To have shock absorption capability when inserting the inner crucible into the outer crucible (shock absorption capability).
(b) To absorb the difference in the volume of deformation between the two crucibles that originates from the difference in thermal expansion coefficient between the material of the outer crucible (graphite) and the material of the inner crucible (quartz) when cooling the crucibles (deformation volume absorbing capability).
(c) To prevent the outer crucible from suffering thickness decrease and silicon-carbidization, which result from the SiO gas produced from the inner crucible and so forth (gas shielding capability).
(d) To conduct heat from the outer crucible to the inner crucible so that the inner crucible has a uniform surface temperature distribution (uniformity in heating).

The crucible protection sheet according to the first invention is formed of expanded graphite; at the same time, the gas permeability thereof that is represented by the above-described equation (1) is less than $1.0 \times 10^{-4}$ cm$^2$/s, and the compression ratio thereof that is represented by the above-described equation (2) is 20% or higher. Therefore, it can satisfy the above characteristics (a) to (c).

The crucible protection sheet according to the second invention is formed of expanded graphite; at the same time, the planar thermal conductivity thereof is 120 W/(m·K) or higher, and the compression ratio thereof that is represented by the above-described equation (2) is 20% or higher. Therefore, it can satisfy the above characteristics (a), (b), and (d).

The crucible protection sheet according to the third invention is formed of expanded graphite; at the same time, the gas permeability thereof that is represented by the above-described equation (1) is less than $1.0 \times 10^{-4}$ cm$^2$/s, the compression ratio thereof that is represented by the above-described equation (2) is 20% or higher, and the planar thermal conductivity thereof is 120 W/(m·K) or higher. Therefore, it can satisfy all the above characteristics (a) to (d).

Hereinbelow, the relationship between the parameters of the crucible protection sheets according to the present invention and the characteristics (a) to (d) will be discussed.

First, the crucible protection sheet of the present invention is made by forming expanded graphite into a sheet shape. The expanded graphite is formed by immersing natural graphite, kish graphite, or the like in a liquid such as sulfuric acid or nitric acid and thereafter subjecting it to a heat treatment at 400° C. or higher.

The expanded graphite is in a flocculent or fiber form, in other words, one in which its axial length is longer than its radial length. For example, the axial length is about 1 mm to 3 mm and the radial length is from about 300 μm to 600 μm. In the interior of the crucible protection sheet of the present invention, filaments of the expanded graphite fiber as described above are entangled with one another.

It should be noted that the crucible protection sheet of the present invention may be formed of only the expanded graphite as described above, but it may contain a little amount (for example, about 5%) of binder such as a phenolic plastic or a rubber component.
(Shock Absorption Capability and Deformation Volume Absorbing Capability)

In the crucible protection sheet formed of the expanded graphite as described above according to the first to third inventions, the compression ratio represented by the above equation (1) is restricted to be 20% or higher. Therefore, even if a force applied in a direction in which the inner crucible is pressed against the outer crucible when inserting the inner crucible into the outer crucible, the crucible protection sheet is compressed and deformed so that the force can be absorbed. That is, the impact that is produced when inserting the inner crucible is absorbed by the crucible protection sheet, so breakage of the inner crucible can be prevented. Accordingly, workability in the inserting work can be improved.

Moreover, even when the inner bottom surface of the outer crucible is uneven, the uneven portion is buried in the crucible protection sheet because the crucible protection sheet has a sufficient compression ratio. Thus, the gap between the outer surface of the inner crucible and the inner surface of the outer crucible can be filled by the crucible protection sheet. Accordingly, when inserting the inner crucible into the outer crucible, the inner crucible is prevented from tilting even if the inner bottom surface of the outer crucible is uneven. Thus, it becomes possible to prevent leakage of the molten silicon that originates from the tilting of the inner crucible inside the outer crucible.

If the thickness of the crucible protection sheet is too thin, there may be cases in which a sufficient margin for shock absorption cannot be obtained although the crucible protection sheet has a compression ratio as described above. In other words, there may be a possibility that the crucible protection sheet cannot absorb the impact when inserting the inner crucible, or that the crucible protection sheet cannot be in close contact with the outer surface of the inner crucible and the inner surface of the outer crucible.

When the crucible protection sheet is sandwiched between the inner crucible and the outer crucible, the crucible protection sheet is bent and deformed so as to be in close contact with the bottom surface of the inner crucible and the inner surface of the outer crucible. If the strength of the crucible protection sheet itself is weak or the flexibility thereof is small at this time, the crucible protection sheet itself may be cracked, chipped, or torn when it is sandwiched between the inner crucible and the outer crucible even though the crucible protection sheet has a compression ratio as described above.

Taking this matter into consideration, it is desirable that the thickness of the crucible protection sheet be from 0.2 mm to 0.6 mm. When the thickness of the crucible protection sheet falls within the just-described range, a sufficient margin for shock absorption can be ensured, the crucible protection sheet can be brought into close contact with the outer surface of the inner crucible and the inner surface of the outer crucible (i.e., the gap between the two crucibles can be filled by the crucible protection sheet), and the crucible protection sheet itself can be prevented from being cracked, chipped, or torn. Furthermore, when the bulk density is 0.5 Mg/m$^3$ or higher, the crucible protection sheet has a certain degree of strength. Therefore, even when the crucible protection sheet deforms, the crucible protection sheet can be prevented from cracks or the like. However, when the bulk density exceeds 1.5 Mg/m$^3$, the shock absorption capability and the deformation volume absorbing capability may degrade.

From the foregoing, it is preferable that the crucible protection sheet in which the compression ratio thereof is restricted as described above be restricted to have a thickness of from 0.2 mm to 0.6 mm and a bulk density of from 0.5 Mg/m$^3$ to 1.5 Mg/m$^3$. It is particularly preferable that the crucible protection sheet be restricted to have a thickness of from 0.4 mm to 0.6 mm and a bulk density of from 0.5 Mg/m$^3$ to 1.5 Mg/m$^3$, because in this way, the crucible protection sheet can be prevented from cracks or the like more reliably and the shock absorption capability and the deformation volume absorbing capability can be increased further.

Furthermore, when the crucible protection sheet has a thickness of from 0.2 mm to 0.6 mm, particularly when from 0.4 mm to 0.6 mm, the crucible protection sheet is kept in such a condition that it can undergo further compression deformation even after the inner crucible is placed in the outer crucible. Accordingly, even though the amount of contraction of the outer crucible becomes greater than the amount of contraction of the inner crucible because of the difference in thermal expansion coefficient between their materials when cooling the entire crucible after fabricating the single crystal silicon, the crucible protection sheet can absorb the difference in the amounts of contraction. Specifically, the crucible protection sheet can also alleviate the expansion-contraction stress produced between the two crucibles when cooling the crucibles, and therefore, it can prevent breakage of the crucibles when cooling the crucibles.

By using a plurality of the crucible protection sheets stacked on each other, the strength can be improved even when the thickness of each one of the crucible protection sheets is thin, and the margin for shock absorption is made greater. Thereby, the crucible protection sheet can be prevented from cracks, and the cushioning capability can also be improved. In this case, it is possible to stack a single sheet of the crucible protection sheet on one another, or it is also possible to use a multi-layered sheet formed by stacking a plurality of the crucible protection sheets in advance.

Furthermore, when the recovery ratio is 5% or higher, the crucible protection sheet can maintain the cushioning capability after the sheet is compressed and then the load is removed. This is preferable for the following reason. Even if the gap between the two crucibles changes because of the difference in the amount of expansion/contraction between the two crucibles during the manufacturing process of the silicon single crystal, the crucible protection sheet can fill the gap between the inner crucible and the outer crucible at all times, as long as the amount of the change of the gap is such a range that the thickness of the crucible protection sheet can be recovered by the crucible protection sheet.

The above-mentioned recovery ratio is according to JIS R 3453, Compressed fiber jointing, and specifically, it is represented by the following equation (3).

$$\text{Recovery ratio (\%)} = [(t_3 - t_2)/(t_1 - t_2)] \times 100, \quad (3)$$

where $t_1$ is the thickness (mm) after applying a pre-load (0.686 MPa±1%) for 15 seconds, $t_2$ is the thickness (mm) after applying a total pressure (34.3 MPa±1%) for 60 seconds, and $t_3$ is the thickness after resetting the pressure to the pre-load and elapsing 60 seconds.

(Gas Shielding Capability)

The crucible protection sheet of the present invention is adjusted so that the gas permeability thereof is less than $1.0 \times 10^{-4}$ cm$^2$/s.

Figure 9:
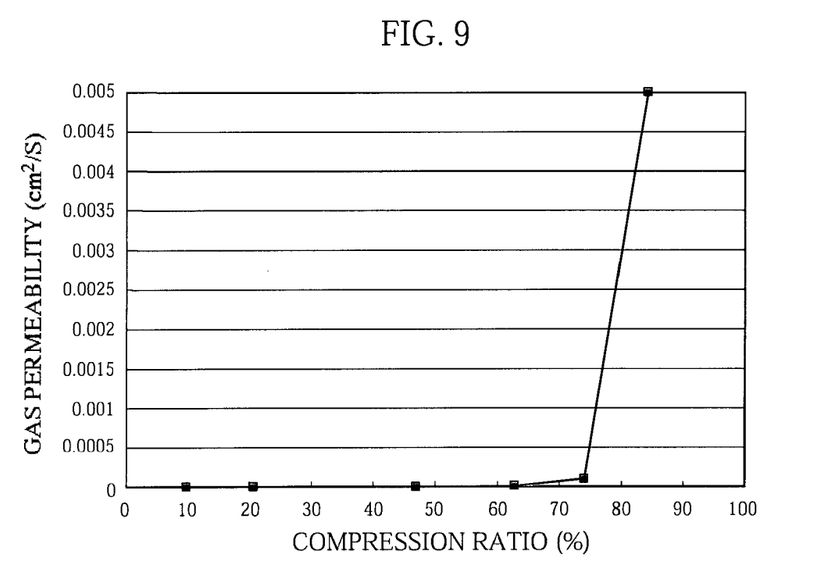
FIG. 9 is a graph for illustrating the relationship between compression ratio and gas permeability in a crucible protection sheet.

When the compression ratio is higher, the gas permeability tends to be higher accordingly (see FIG. 9). However, by controlling the gas permeability to be less than $1.0 \times 10^{-4}$ cm$^2$/s, the SiO gas that is produced when heating the inner crucible is prevented from passing through the crucible protection sheet even if the compression ratio of the crucible protection sheet is in the above-described range. As a result, the SiO gas is prevented from passing through the crucible protection sheet and reacting with the outer crucible, so the outer crucible is hindered from silicon-carbidization. Therefore, the lifetime of the outer crucible can be lengthened, and also, the manufacturing cost of the silicon single crystal can be reduced.

If SiO gas passes through the crucible protection sheet, the SiO gas that flows into the gap between the crucible protection sheet and the outer crucible is heated. Then, convection of the SiO gas occurs between the crucible protection sheet and the outer crucible. The convention erodes the outer crucible, which may result in a thickness decrease of the outer crucible. This phenomenon is particularly noticeable in a R portion of the crucible (i.e., curved portion, see the portion A in FIG. 2). If such a thickness decrease develops, the outer crucible may crack.

However, when the gas permeability is less than $1.0 \times 10^{-4}$ cm$^2$/s, the amount of gas that flows into the gap between the crucible protection sheet and the outer crucible is small in the first place. As a result, it becomes possible to prevent the occurrence of convection as described above and the thickness decrease of the outer crucible resulting from the convention.

It should be noted that it is difficult to prevent gas permeation completely even when the crucible protection sheet has a gas permeability such as described above. Nevertheless, when the crucible protection sheet has a compression ratio and a recovery ratio such as described above, the crucible protection sheet can fill the gap between the inner crucible and the outer crucible can at all times. This means that no gap that allows the SiO gas to cause convection exists between the two both crucibles, so the effect of preventing the thickness decrease of the outer crucible becomes more significant.

Moreover, the convection of the SiO gas occurs in the vicinity of the portion at which the side face and the bottom face of the crucible is connected (i.e., the A portion in FIG. 2); therefore, the crucible protection sheet of the present invention may be provided only in the vicinity of the portion at which the side face and the bottom face of the crucible is connected, if the purpose is merely to prevent such a convection only. Furthermore, the gas shielding capability can be enhanced by stacking a plurality of the crucible protection sheets or by using a multi-layered sheet comprising a plurality of the crucible protection sheets, even when the gas shielding capability of each sheet is not very high.

(Thermal Conductivity and Uniformity in Heating)

The quartz inner crucible has a thermal conductivity of 2 W/(m·K) at highest. In contrast, the crucible protection sheet of the present invention has a planar thermal conductivity of 120 W/(m·K) or higher.

The temperature of the outer crucible inner surface does not necessarily have a uniform temperature distribution upon starting heating, so the crucible protection sheet may also have a temperature distribution when heated. However, when the planar thermal conductivity of the crucible protection sheet of the present invention is 120 W/(m·K) or higher as described above, a uniform temperature distribution will result within an extremely short time. This makes it possible to heat the inner crucible made of quartz, which has a very low planar thermal conductivity, substantially uniformly. Thereby, the temperature of the silicon in the inner crucible is also made substantially uniform. As a result, the quality of the manufactured silicon single crystal is improved remarkably.

Furthermore, the temperature increase of the inner crucible upon starting heating and the temperature drop of the inner crucible upon starting cooling become more quick, so the productivity of the silicon single crystal improves.

In addition, the planar thermal conductivity of the crucible protection sheet of the present invention is 120 W/(m·K) or higher, and the crucible protection sheet is adjusted so that the planar thermal conductivity is substantially uniform across the plane.

More specifically, the crucible protection sheet is adjusted to be as follows. When portions of the crucible protection sheet are cut out in a square shape having a side of 200 mm to form square-shaped test regions each having a side of 25 mm and the thermal conductivity of each test region is measured, the quotient obtained by dividing the difference between the thermal conductivity of the test region having the greatest thermal conductivity and the thermal conductivity of the test region having the least thermal conductivity by the mean value of the thermal conductivities of all the test regions should be restricted to be 0.1 or less.

If the thermal conductivity of the crucible protection sheet is not uniform, a heat spot having a higher temperature than other portions may form in a portion with a low thermal conductivity. If the heat spot is formed in the crucible protection sheet, only the portion of the inner crucible made of quartz that is in contact with the heat spot may have a higher temperature than the other portion of the inner crucible. This may result in the following problems. The silicon in the inner crucible may not have a uniform temperature, resulting in degradation in the quality of the silicon single crystal. Also, only that portion of the inner crucible is softened, and consequently, the inner crucible may crack.

The crucible protection sheet of the present invention, however, is manufactured so that the thermal conductivity thereof has the characteristics such as described above, and therefore, it can prevent the degradation in the quality of the silicon single crystal and the softening of the inner crucible.

The crucible protection sheet of the present invention can be manufactured so that the thermal conductivity of the crucible protection sheet is substantially uniform across the plane in the following method.

First, natural graphite, kish graphite, or the like is immersed in a liquid such as sulfuric acid or nitric acid, and is thereafter subjected to a heat treatment at 400° C. or higher, to form flocculent graphite (expanded graphite). This expanded graphite has a thickness of 1.0 mm to 30.0 mm and a bulk density of 0.1 Mg/m$^3$ to 0.5 Mg/m$^3$. The resulting expanded graphite is compressed to a thickness of 0.2 mm to 0.6 mm and a bulk density of 0.5 to 1.5 Mg/m$^3$, to form a crucible protection sheet.

At this time, formation of creases or the like on the surface of the crucible protection sheet is prevented by compressing the expanded graphite by roll-pressing at a feed rate of 20.0 m/min. Thereby, it is possible to prevent formation of a portion with a lower thermal conductivity, which results from the creases. Thus, a crucible protection sheet with a uniform thermal conductivity can be manufactured. It should be noted that the productivity of the expanded graphite is poor when the feed rate is less than 0.1 m/min. For this reason, it is preferable that the feed rate be from 0.1 m/min to 20.0 m/min, more preferably from 0.5 m/min to 15.0 m/min.

Second Embodiment

Next, a second embodiment of the invention will be described. The equipment for manufacturing silicon single crystals and the structure of the crucible 1 are the same as those in the first embodiment, and therefore the details thereof will be omitted. For this reason, the following description discusses the points that differ from the first embodiment.

(Proportions of the Specific Elements in the Crucible Protection Sheet)

It is preferable that the crucible protection sheet 4 be adjusted so that the amount of the specific elements among a plurality of impurities contained therein is 3 mass ppm or less, and more preferably, the amount of each of them is 1 mass ppm or less. The specific elements refer to metalloid elements and metallic elements. Examples of the metalloid elements include boron, phosphorus, arsenic, antimony, and bismuth, and examples of the metallic elements include iron and indium. The reason why such a restriction is made is that these elements greatly affect the product quality of the manufactured single crystal silicon and the manufacturing process when contained in the polycrystalline silicon that is a raw material of the single crystal silicon.

When the amount of the specific elements, which greatly affect the quality of the single crystal silicon, is suppressed in the crucible protection sheet 4 as described above, the crucible protection sheet 4 can prevent quality abnormality of the product and problems in the manufacturing process effectively even though the quality of the crucible protection sheet 4 as a whole is not so high. As a result, the manufacture of the crucible protection sheet 4 and the quality control of the crucible protection sheet 4 become easy. Thus, while the manufacturing cost of the product is kept low, the product quality can be kept high.

It should be noted that not all the amounts of the specific elements may be 3 mass ppm or less. It is sufficient that the amounts of the specific elements that greatly affect the characteristics required for the single crystal silicon to be manufactured are 3 mass ppm or less, more preferably 1 mass ppm or less.

When the characteristics of the single crystal silicon to be manufactured are affected by the amounts of a plurality of specific elements, it is preferable that the total amount of the selected plurality of specific elements be 10 mass ppm or less, more preferably 5 mass ppm or less.

(Amount of Impurities in the Entire Crucible)

The outer crucible 3 is adjusted (purified) so that the content of the impurities contained therein (total ash content) is 20 mass ppm or less, more preferably 10 mass ppm or less. The crucible protection sheet 4 is adjusted (purified) so that the content of the impurities contained therein (total ash content) is 100 mass ppm or less, more preferably 50 mass ppm or less.

In recent years, the requirements for the purity of the product have been more and more severe. Accordingly, higher purity is demanded for the crucible 1 and the crucible protection sheet 4 used for the manufacture. In order to meet the demand, higher purified sheets have been developed for the crucible protection sheet 4 that is arranged between the inner crucible 2 and the outer crucible 3.

The crucible apparatus of the invention of the present application, however, makes it possible to obtain a high purity product even with a crucible protection sheet 4 having the same level of ash content as the conventional sheet, for example, with a crucible protection sheet having an ash content of from greater than 50 mass ppm to 100 mass ppm or less, by controlling the ash content of the outer crucible 3 to 20 mass ppm or less.

Specifically, for example, in the case of the outer crucible 3 having an inner diameter of 18 inches, the weight is about 30 kg; therefore, if the ash content is 20 mass ppm, the ash content is about 0.6 g. In the case that the entire inner surface of the outer crucible 3 is covered with the crucible protection sheet 4, the size of the crucible protection sheet 4 is about 480 mm in diameter; therefore, when the thickness thereof is 1 mm and the bulk density is 1.5 Mg/m$^3$, the weight thereof is about 270 g. In this case, when the ash content of the crucible protection sheet 4 is 100 mass ppm, the ash content contained in the crucible protection sheet 4 is about 0.03 g and the total ash content of the crucible apparatus as a whole is about 0.63 g; in other words, the ash content with respect to the entire crucible apparatus is about 20 mass ppm.

Taking into consideration that the weight of the polycrystalline silicon molten by the crucible apparatus having the above-described outer crucible 3 is about 60 kg, it is believed that the total ash content contained in the crucible apparatus is small relative to the weight of the polycrystalline silicon.

As described above, the total ash content, which is the total of the ash contents contained in the outer crucible 3 and the crucible protection sheet 4, is small in the crucible apparatus of the present invention. Therefore, the amount of impurities that contaminate the material is lessened. Moreover, the quality of each of the components need not be increased more than necessary. In particular, the manufacture and quality control of the outer crucible 3 and the crucible protection sheet 4 are easy since the quality of the crucible protection sheet 4, which is difficult to purify, need not be increased unnecessarily. Thus, while the manufacturing cost of the product is kept low, the product quality can be kept high.

It is particularly preferable that the outer crucible 3 have an ash content of about 20 mass ppm or less, more preferably about 10 mass ppm or less, so that the manufacture and quality control of the outer crucible 3 as well as keeping the product quality can be performed efficiently. Likewise, it is preferable that the crucible protection sheet 4 have an ash content of about 100 mass ppm, more preferably about 50 mass ppm, so that the manufacture and quality control of the crucible protection sheet 4 as well as keeping the product quality can be performed efficiently.

The method for adjusting the outer crucible 3 and the crucible protection sheet 4 to have the ash contents as described above is not particularly limited. For example, it is possible to remove impurities by contacting the outer crucible 3 and the crucible protection sheet 4 with a halogen gas. Specifically, the ash content of the crucible protection sheet 4 may be adjusted in the following manner. For example, an expanded graphite sheet with a predetermined bulk density is heated at 800° C. or higher for 5 to 24 hours under a reduced pressure of from 100 to 1 Torr or below in the presence of a halogenated organic substance, then cooled and thereafter compression-formed, whereby the crucible protection sheet 4 is produced. It is also possible to perform an additional step in which the supply of the halogenated organic substance is stopped after the above-described heating treatment with a halogenated organic substance, and subsequently the sheet is treated at 800° C. or higher under a reduced pressure of 100 to 1 Torr while supplying a hydrogen gas in place of the halogenated organic substance.

EXAMPLES

First Example

The compression ratio and the recovery ratio were studied for samples of the crucible protection sheet of the present invention when compressing the crucible protection sheet with a pressure of 34.3 MPa in a thickness direction. It should be noted that the compression ratio is defined by the foregoing equation (2) and the recovery ratio is defined by the foregoing equation (3).

(Details of the Experiment)

The relationship of the bulk density with the compression ratio and the recovery ratio was studied for the crucible protection sheet having a thickness of 0.5 mm when the bulk densities were set at 0.1, 0.5, 0.8, 1.0, 1.2, 1.5, and 1.8 Mg/m$^3$.

(2) By using a halogen gas, the concentration of ash content (impurities) of the crucible protection sheet was adjusted to 10 mass ppm or less.

(Results of the Experiment)

Figure 3:
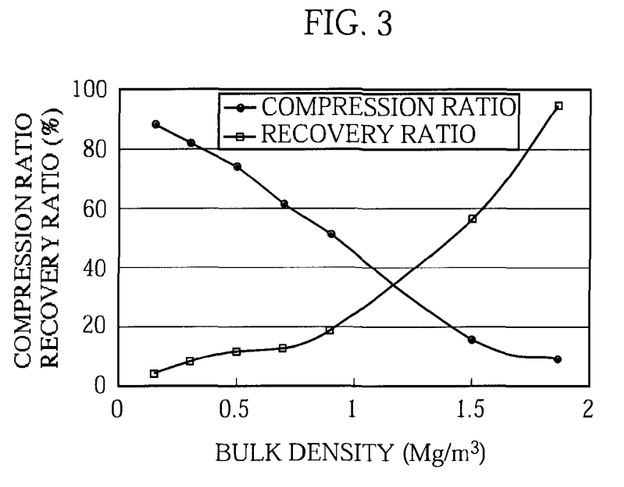
FIG. 3 is a graph for illustrating the relationship between bulk density versus compression ratio and recovery ratio in a crucible protection sheet.
Figure 4:
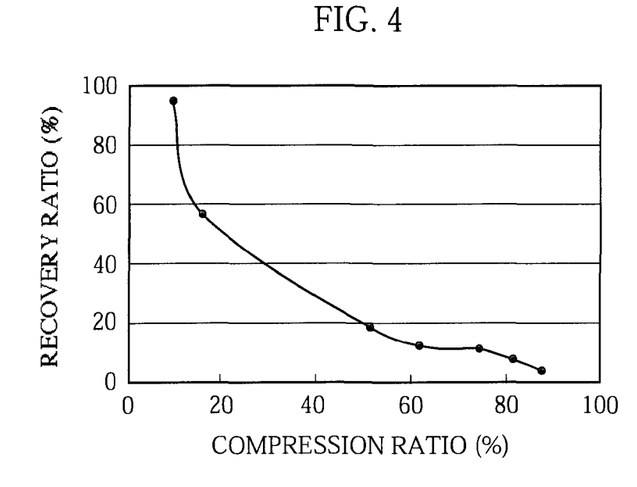
FIG. 4 is a graph for illustrating the relationship between compression ratio and recovery ratio in a crucible protection sheet.

As shown in FIG. 3, it is confirmed that when the bulk density is greater, the compression ratio is lower but the recovery ratio is higher. As for the relationship between the compression ratio and the recovery ratio, as shown in FIG. 4, it is confirmed that when the compression ratio is greater, the recovery ratio is lower. In other words, it is understood that there is a trade-off between the compression ratio and the recovery ratio.

Second Example

The relationship of the thickness of the sheet with the bendability and the shock absorbency was studied for the crucible protection sheet of the present invention.

(Details of the Experiment)
(1) The bulk densities of the crucible protection sheet were 0.1, 0.3, 0.5, 0.7, 1.0, 1.5, and 1.7 Mg/m$^3$, and the thicknesses thereof were 0.1, 0.2, 0.4, 0.6, and 1.0 mm.
(2) The outer crucible used was IG-110 made by Toyo Tanso Co., Ltd (inner diameter φ500 mm, height 490 mm), the inner crucible used was a quartz crucible (outer diameter φ480 mm, height 500 mm).
(3) By using a halogen gas, the concentration of ash content (impurities) of the crucible protection sheet was adjusted to 10 mass ppm or less.

(Evaluation)
(1) The inner crucible was inserted into the outer crucible with the crucible protection sheet being placed on the inner surface of the outer crucible, and the bendability and shock absorbency of the sheet were evaluated by visually observing damages to the crucible protection sheet.
(2) Specifically, the crucible protection sheet was determined as "excellent" when the bendability was good, the sheet had no crack, breakage, or chipping, and moreover the shock absorbency was good. When the bendability and the shock absorbency were allowable, the sheet was determined as "good". When either the bendability or the shock absorbency was found to be poor, the sheet was determined as "fair". When both the bendability and the shock absorbency were poor, the sheet was determined as "poor". The results are show in Table 1.

TABLE 1

|  |  | Thickness (mm) | | | | |
|---|---|---|---|---|---|---|
|  |  | 0.1 | 0.2 | 0.4 | 0.6 | 1.0 |
| Bulk density (Mg/m$^3$) | 0.1 | poor | poor | fair | fair | fair |
|  | 0.3 | poor | poor | fair | fair | fair |
|  | 0.5 | poor | good | excellent | excellent | fair |
|  | 0.7 | poor | good | excellent | excellent | fair |
|  | 1.0 | poor | good | excellent | excellent | fair |
|  | 1.5 | poor | good | excellent | excellent | fair |
|  | 1.7 | poor | fair | fair | fair | fair |

(Results of the Experiment)

Generally, the crucible protection sheet made of expanded graphite shows higher strength when the bulk density of the crucible protection sheet is greater. However, as shown in Table 1, in the cases that the thickness of the crucible protection sheet is too thin (0.1 mm), a sufficient strength cannot be obtained even when the bulk density is great. As a consequence, if a bending force is applied to the crucible protection sheet when installing the crucible, the crucible protection sheet may suffer from breakage, cracks, chipping, or the like. Moreover, the margin for shock absorption is insufficient.

On the other hand, in the cases that the thickness of the crucible protection sheet is too thick (1 mm), there is a sufficient margin for shock absorption, and the sheet also has a sufficient strength so workability does not become poor. However, the bendability is poor, so cracking or chipping occurs if a bending force is applied to the crucible protection sheet when installing the crucible.

In the cases that the bulk density is small, the bendability is low because the strength is insufficient; as a consequence, in the cases other than when the thickness of the crucible protection sheet is 1 mm, cracking or chipping occurs if a bending force is applied to the crucible protection sheet. Conversely, in the cases that bulk density is 1.7 Mg/m$^3$, the compressibility is low; therefore, even if the thickness is large, there is no sufficient margin for shock absorption.

From the foregoing, when the thickness of the crucible protection sheet is from 0.2 mm to 0.6 mm and at the same time the bulk density is from 0.5 to 1.5 Mg/m$^3$, it is possible to ensure a sufficient margin for shock absorption, good bendability, and high strength of the crucible protection sheet. It is particularly preferable that the thickness of the crucible protection sheet be from 0.4 mm to 0.6 mm because the margin for shock absorption is great and the sheet strength is high. Moreover, when a plurality of such crucible protection sheets are stacked on each other, no crack or chipping is caused because the crucible protection sheet itself is thin. As a result, the cushioning capability and the gas shielding capability can be improved further.

Third Example

The gas permeability represented by the foregoing equation (1), the compression ratio represented by the foregoing equation (2), and the thermal conductivity were studied for the crucible protection sheet of the present invention.

(Details of the Experiment)
(1) The compression ratio, gas permeability, and thermal conductivity were determined for the crucible protection sheet having a thickness of 0.5 mm when the bulk densities were set at 0.1, 0.3, 0.5, 0.7, 1.0, 1.5, and 1.7 Mg/m$^3$.
(2) The specific method for measuring the gas permeability was as follows.
a) In a pair of hermetically closed chambers CA and CB that are in communication with each other, a crucible protection sheet of the present invention (diameter 30 mm) is disposed so as to close the passage (diameter 10 mm) that allows the two chambers CA and CB to communicate with each other. In other words, the air is not permitted to flow between the pair of hermetically closed chambers CA and CB unless the air passes through the crucible protection sheet.
b) From this condition, the chambers CA and CB are evacuated until the air pressure in the two chambers CA and CB becomes 1.0×10$^{-4}$ Pa. Then, while one of the chamber CA is being kept evacuated, N$_2$ gas is supplied until the other one of the chamber CB reaches a predetermined pressure (1.0×10$^5$ Pa).
c) When the other one of the chamber CB reaches a predetermined pressure (1.0×10$^5$ Pa), the evacuation of the one of the chamber CA is stopped. Then, the N$_2$ gas gradually flows from the other one of the chamber CB to the one of the chamber CA according to the pressure difference between the two chambers CA and CB and the gas permeability of the crucible protection sheet. As a result, the pressure in the one of the chamber CA increases.
d) Then, the rate of pressure increase in the one of the chamber CA was measured for about 100 seconds after stopping the evacuation of the one of the chamber CA, and the gas permeability K (cm$^2$/s) was calculated according to the following equation (1).

$$K = Q \cdot L / (\Delta P \cdot A) \tag{1}$$

In the above equation (1), Q is the gas flow rate (Pa·cm$^3$/s), ΔP is the pressure difference (Pa) between the two chambers CA and CB, A is the gas transmission area (cm$^2$) of the crucible protection sheet, which is the area of a passage that allows the two chambers CA and CB to communicate with each other, and L is the thickness (cm) of the crucible protection sheet (test specimen). The gas flow rate Q can be calculated from the volumetric capacity of the one of the chamber CA and the rate of pressure increase inside the one of the chamber CA for about 100 seconds after stopping the evacuation of the one of the chamber CA.

(Results of the Experiment)

Figure 5:
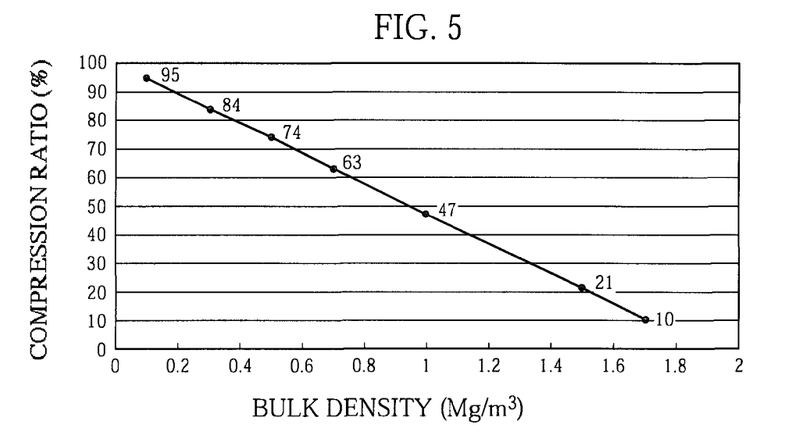
FIG. 5 is a graph for illustrating the relationship between bulk density and recovery ratio in a crucible protection sheet.
Figure 6:
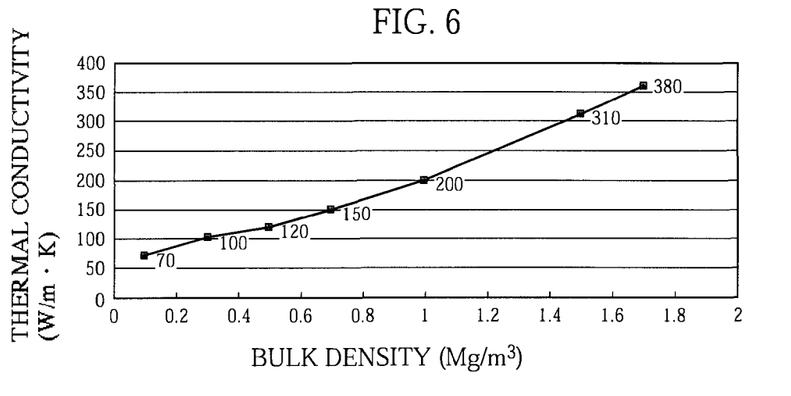
FIG. 6 is a graph for illustrating the relationship between bulk density and thermal conductivity in a crucible protection sheet.
Figure 7:
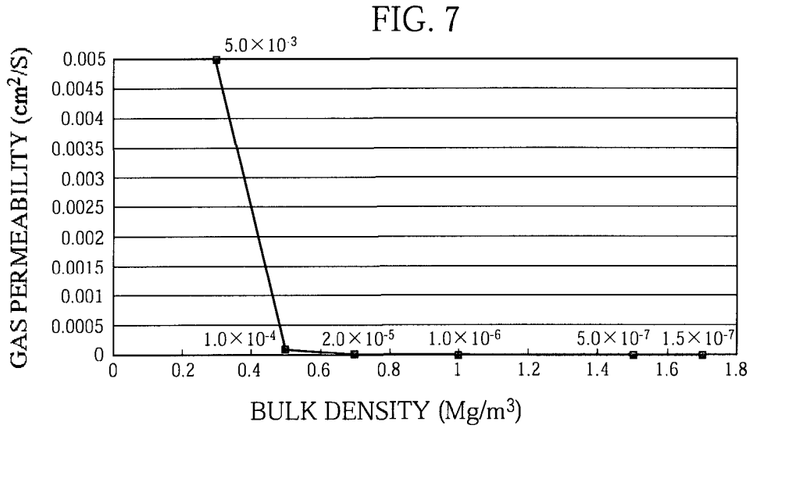
FIG. 7 is a graph for illustrating the relationship between bulk density and gas permeability in a crucible protection sheet.

As shown in FIGS. 5 and 6, it is confirmed that when the bulk density is greater, the compression ratio is lower but the thermal conductivity is higher. In addition, as shown in FIG. 7, it is confirmed that when the bulk density is greater, the gas permeability is lower, in other words, when the bulk density is greater, the gas shielding capability is higher.

Figure 8:
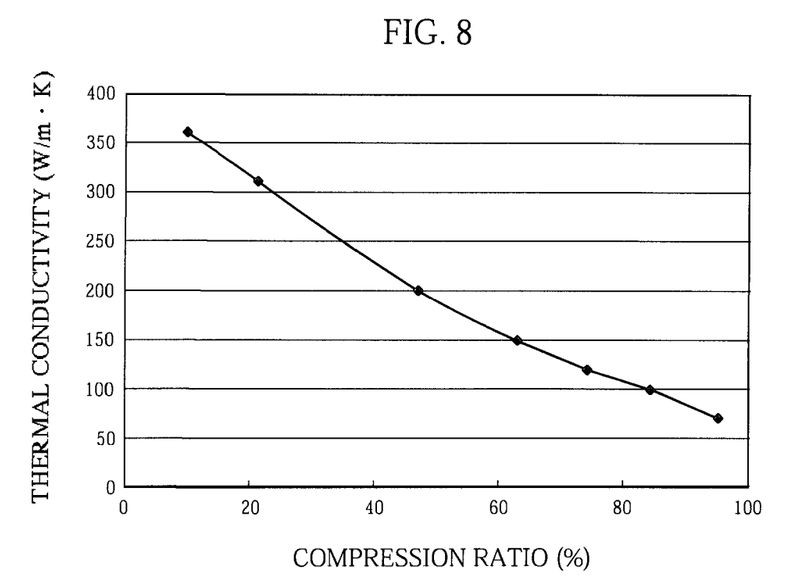
FIG. 8 is a graph for illustrating the relationship between compression ratio and thermal conductivity in a crucible protection sheet.

In addition, as shown in FIG. 8, by studying the relationship between the compression ratio and the thermal conductivity, it is confirmed that when the compression ratio is higher, the thermal conductivity is lower. In other words, it is understood that there is a trade-off between the compression ratio and the thermal conductivity.

Furthermore, as shown in FIG. 9, by studying the relationship between the compression ratio and the gas permeability, it is confirmed that when the compression ratio is lower, the gas permeability is less (i.e., the gas shielding capability is higher). In other words, it is understood that there is a trade-off between the compression ratio and the gas shielding capability.

Fourth Example

The expanded graphite sheets (crucible protection sheets) having thicknesses of 0.2 mm to 0.6 mm and bulk densities of 0.5 Mg/m$^3$ to 1.5 Mg/m$^3$ according to the present invention were compared in terms of non-uniformity in thermal conductivity.

(Details of the Experiment)

The non-uniformity in thermal conductivity was determined as follows. 9 pieces of test specimens each with dimensions of 25×25 mm were cut out from each samples of the crucible protection sheet of the present invention with dimensions of 200×200 mm. The quotients each obtained by dividing the difference between the maximum value (Max.) and the minimum value (Min.) of the planar thermal conductivity of each test specimen by the average thermal conductivity (Ave.) were compared.

TABLE 2

| | | Thickness (mm) | | |
|---|---|---|---|---|
| | | 0.2 | 0.4 | 0.6 |
| Bulk density (Mg/m$^3$) | 0.5 | 0.08 | 0.07 | 0.06 |
| | 1.0 | 0.07 | 0.06 | 0.05 |
| | 1.5 | 0.08 | 0.07 | 0.06 |

The unit for planar thermal conductivity is W/(m·K).

(Results of the Experiment)

As shown in Table 2, it was confirmed that the samples in which the thickness of the crucible protection sheet was from 0.2 mm to 0.6 mm and the bulk density was from 0.5 Mg/m$^3$ to 1.5 Mg/m$^3$ exhibited a thermal conductivity variation of 0.1 or less, and their uniformity in heating was excellent.

Industrial Applicability

The crucible protection sheet of the present invention is suitable for a sheet used for protecting the outer crucible and the inner crucible and uniformizing heat during the manufacture of silicon single crystals by a CZ process.

BRIEF DESCRIPTION OF THE DRAWINGS

FIG. 1 is a schematic illustrative view of equipment for manufacturing silicon single crystals or the like.

| DESCRIPTION OF REFERENCE NUMERALS | |
|---|---|
| 1 | crucible |
| 2 | inner crucible |
| 3 | outer crucible |
| 4 | crucible protection sheet |

The invention claimed is:

1. A crucible protection sheet comprising expanded graphite and being arranged between an inner crucible containing silicon and an outer crucible containing graphite, the crucible protection sheet being characterized in that:

the gas permeability represented by the following equation (1) is $1.0 \times 10^{-4}$ cm$^2$/s or less, and the compression ratio represented by the following equation (2) is 20% or higher and 74% or lower:

$$\text{Gas permeability} = Q \cdot L / (\Delta P \cdot A) \tag{1}$$

where Q is the gas flow rate (Pa·cm$^3$/s), ΔP is the pressure difference (Pa) between two chambers, A is the gas transmission area (cm$^2$) of the crucible protection sheet, which is the area of a passage that allows the two chambers to communicate with each other, and L is the thickness (cm) of the crucible protection sheet, and $$\text{Compression ratio (\%)} = [(t_1 - t_2)/t_1] \times 100 \tag{2}$$

where $t_1$ is the thickness (mm) after applying a pre-load (0.686 MPa±1%) for 15 seconds, and $t_2$ is the thickness (mm) after applying a total pressure (34.3 MPa±1%) for 60 seconds, wherein the thickness is from 0.2 mm to 0.6 mm, wherein the bulk density is from 0.5 Mg/m$^3$ to 1.5 Mg/m$^3$, wherein the planar thermal conductivity is 120 W/(m·K) or higher, and wherein, when the sheet in a square shape having a side of 200 mm is divided into square-shaped test regions each having a side of 25 mm and the thermal conductivity of each test region is measured, the quotient obtained by dividing the difference between the thermal conductivity of the test region having the greatest thermal conductivity and the thermal conductivity of the test region having the least thermal conductivity by the mean value of the thermal conductivities of all the test regions is restricted to be 0.1 or less.

2. A crucible protection sheet comprising expanded graphite and being arranged between an inner crucible containing silicon and an outer crucible containing graphite, the crucible protection sheet being characterized in that:

the planar thermal conductivity is 120 W/(m·K) or higher, and the compression ratio represented by the following equation (2) is 20% is higher and 74% or lower:

$$\text{Compression ratio (\%)} = [(t_1-t_2)/t_1] \times 100 \quad (2)$$

where $t_1$ is the thickness (mm) after applying a pre-load (0.686 MPa±1%) for 15 seconds, and $t_2$ is the thickness (mm) after applying a total pressure (34.3 MPa±1%) for 60 seconds, wherein the thickness is from 0.2 mm to 0.6 mm, wherein the bulk density is from 0.5 Mg/m$^3$ to 1.5 Mg/m$^3$, wherein, when the sheet in a square shape having a side of 200 mm is divided into square-shaped test regions each having a side of 25 mm and the thermal conductivity of each test region is measured, the quotient obtained by dividing the difference between the thermal conductivity of the test region having the greatest thermal conductivity and the thermal conductivity of the test region having the least thermal conductivity by the mean value of the thermal conductivities of all the test regions is restricted to be 0.1 or less.

3. The crucible protection sheet according to claim 1, wherein the recovery ratio represented by the following equation (3) is 5% is higher:

$$\text{Recovery ratio (\%)} = [(t_3-t_2)/(t_1-t_2)]100, \quad (3)$$

where $t_1$ is the thickness (mm) after applying a pre-load (0.686 MPa±1%) for 15 seconds, $t_2$ is the thickness (mm) after applying a total pressure (34.3 MPa±1%) for 60 seconds, and $t_3$ is the thickness after resetting the pressure to the pre-load and elapsing 60 seconds.

4. The crucible protection sheet according to claim 2, herein the recovery ratio represented by the following equation (3) is 5% or higher:

$$\text{Recovery ratio (\%)} = [(t_3-t_2)/(t_1-t_2)]100, \quad (3)$$

where $t_1$ is the thickness (mm) after applying a pre-load (0.686MPa±1%) for 15 seconds, $t_2$ is the thickness (mm) after applying a total pressure (34.3 MPa±1%) for 60 seconds, and $t_3$ is the thickness after resetting the pressure to the pre-load and elapsing 60 seconds.

5. The crucible protection sheet according to claim 1, wherein the recovery ratio represented by the following equation (3) is 5% or higher:

$$\text{Recovery ratio (\%)} = [(t_3-t_2)/(t_1-t_2)]100, \quad (3)$$

where $t_1$ is the thickness (mm) after applying a pre-load (0.686 MPa±1%) for 15 seconds, $t_2$ is the thickness (mm) after applying a total pressure (34.3 MPa±1%) for 60 seconds, and $t_3$ is the thickness after resetting the pressure to the pre-load and elapsing 60 seconds.

6. The crucible protection sheet according to claim 1, wherein the total amount of impurities is 10 mass ppm or less.

7. The crucible protection sheet according to claim 2, wherein the total amount of impurities is 10 mass ppm or less.

8. The crucible protection sheet according to claim 1, wherein the total amount of impurities is 100 mass ppm or less, and among a plurality of impurities contained therein, the amount of at least one element of boron, phosphorus, arsenic, antimony, bismuth, and a metallic element is 3 mass ppm or less.

9. The crucible protection sheet according to claim 2, wherein the total amount of impurities is 100 mass ppm or less, and among a plurality of impurities contained therein, the amount of at least one element of boron, phosphorus, arsenic, antimony, bismuth, and a metallic element is 3 mass ppm or less.

10. The crucible protection sheet according to claim 8, wherein the metallic element is iron or indium.

11. The crucible protection sheet according to claim 9, wherein the metallic element is iron or indium.

12. The crucible protection sheet according to claim 10, wherein the amount of each of the boron, the phosphorus, the arsenic, the antimony, the bismuth, the iron, and the indium is 3 mass ppm or less.

13. The crucible protection sheet according to claim 11, wherein the amount of each of the boron, the phosphorus, the arsenic, the antimony, the bismuth, the iron, and the indium is 3 mass ppm or less.

14. The crucible protection sheet according to claim 10, wherein the total amount of the boron, the phosphorus, the arsenic, the iron, the antimony, the indium, and the bismuth is 10 mass ppm or less.

15. The crucible protection sheet according to claim 11, wherein the total amount of the boron, the phosphorus, the arsenic, the iron, the antimony, the indium, and the bismuth is 10 mass ppm or less.

16. A crucible protection sheet material comprising a plurality of crucible protection sheets stacked on each other, each being the crucible protection sheet according to claim 1.

17. A crucible protection sheet material comprising a plurality of crucible protection sheets stacked on each other, each being the crucible protection sheet according to claim 2.

18. The crucible protection sheet according to claim 1, wherein the compression ratio is 20% or higher and 60% or lower.

19. The crucible protection sheet according to claim 2, wherein the compression ratio is 20% or higher and 60% or lower.

* * * * *

UNITED STATES PATENT AND TRADEMARK OFFICE
CERTIFICATE OF CORRECTION

| | | |
|---|---|---|
| PATENT NO. | : 8,864,908 B2 | Page 1 of 1 |
| APPLICATION NO. | : 12/373182 | |
| DATED | : October 21, 2014 | |
| INVENTOR(S) | : Yoshiaki Hirose et al. | |

It is certified that error appears in the above-identified patent and that said Letters Patent is hereby corrected as shown below:

On the title page, under abstract "19 Claims, 4 Drawing Sheets" should read -- 18 Claims, 4 Drawing Sheets --.

In the Claims

Col. 21, line 45 - Col. 22, line 2, Claim 5
Delete

"5. The crucible protection sheet according to claim 1, wherein the recovery ratio represented by the following equation (3) is 5% or higher:
Recovery ratio (%) = [($t_3 - t_2$) / ($t_1 - t_2$)] × 100, (3)
where t1 is the thickness (mm) after applying a pre-load (0.686 MPa±1%) for 15 seconds t2 is the thickness (mm) after applying a total pressure (34.3 MPa±1%) for 60 seconds, and t3 is the thickness after resetting the pressure to the pre-load and elapsing 60 seconds."

Signed and Sealed this
Seventeenth Day of March, 2015

Michelle K. Lee
*Director of the United States Patent and Trademark Office*